United States Patent [19]
Galili et al.

[11] Patent Number: 5,329,117
[45] Date of Patent: Jul. 12, 1994

[54] DEVICE FOR DISPENSING PREDETERMINED DOSAGES OF FLOWABLE MATERIAL

[75] Inventors: Yuval Galili; Yiftach Hexter, both of Kvutzat Geva, Israel

[73] Assignee: Baccarat Mitkanei Pikud Pneumatiyim le Automatzia Kvutzat Geva, Kvutzat Geva, Israel

[21] Appl. No.: 3,805

[22] Filed: Jan. 13, 1993

[30] Foreign Application Priority Data

Jan. 16, 1992 [IL] Israel .................................... 100.684

[51] Int. Cl.$^5$ ............................................. G01V 9/04
[52] U.S. Cl. ................................. 250/221; 250/214 B
[58] Field of Search ................ 250/221, 222.1, 214 B, 250/208.3; 222/52

[56] References Cited

U.S. PATENT DOCUMENTS

| | | | |
|---|---|---|---|
| 4,645,094 | 2/1987 | Acklin et al. | 222/52 |
| 4,669,218 | 6/1987 | Kornbrekke et al. | 250/221 |
| 4,722,372 | 2/1988 | Hoffman et al. | 250/221 |
| 4,742,337 | 5/1988 | Haag | 250/221 |

Primary Examiner—David C. Nelms
Attorney, Agent, or Firm—Sughrue, Mion, Zinn, Macpeak & Seas

[57] ABSTRACT

A dosing dispenser for flowable material, including a container having a material introducing aperture and an outlet through which material can pass by gravity, an electrically operated valve having a nozzle coupled to the outlet, for controlling the passage of material therethrough, an electromagnetic radiation emitter located in close proximity to the nozzle, for emitting a controlled radiation beam in the vicinity of the nozzle and an electromagnetic radiation detector located adjacent to the emitter and responsive to radiation emitted from the emitter and reflected by a body placed along the emitted radiation path. The emitter and detector are affixed in a radiation directing and shielding housing, for determining the directivity of the emitted and reflected radiation. There is also provided an electronic control circuit for controlling the valve in response to detected radiation reflected by the body placed along the emitted radiation path.

5 Claims, 3 Drawing Sheets

DEVICE FOR DISPENSING PREDETERMINED DOSAGES OF FLOWABLE MATERIAL

The present invention relates to a dispenser for dispensing predetermined dosages of flowable material. More particularly, the invention relates to an apparatus for automatically dispensing predetermined quantities Of flowable material, such as liquid soap, powder or the like, from a container.

Devices for automatically delivering small predetermined doses of liquid soap or the like, onto the hands of the user without requiring manual contact with the devices, are well known. Such devices generally include a container for storing the soap, an electromechanical actuator for dispensing the soap from the container and electrical control means for controlling the operation of the mechanical actuator. The control means is based on the interruption by the user's hands of a constantly illuminating beam, such as described in U.S. Pat. Nos. 3,327,901 and 4,938,384. There are also known other photoelectric controlled dispensers using proximity sensors or dispensers actuated by reflected light, as described in U.S. Pat. No. 4,921,150.

While these prior art devices do perform the task for which they were designed, namely, to deliver predetermined doses of material onto the user's hands without touching the device, they suffer from various disadvantages. The major ones include the inherent need for an electrical source capable of providing a relative high electrical power requirement, which is normally fulfilled by an A.C. installation only, or alternatively, when there is provided a battery as a sole power source, the device has to be frequently serviced for the replacement of the fast draining battery source required to energize relatively high power consumption loads, such as electromechanical moving parts as a rotor peristaltic pump operated by a gear motor (U.S. Pat. No. 4,921,150), or merely a regular pump (U.S. Pat. No. 4,938,384), for overcoming the force of gravity when raising viscous liquid through a narrow conduit and ejecting same therefrom.

It is therefore a broad object of the present invention to ameliorate the disadvantages of the prior art dispensers and to provide a relatively, compact, portable, low power consumption dosing dispenser.

It is a further object of the invention to provide a dosing dispenser composed of a minimal number of moving parts and having improved immunity to background noise.

In accordance with the present invention there is provided a dosing dispenser for flowable material, comprising a container having a material introducing aperture and an outlet through which material can pass by gravity, electrically operated valve means having a nozzle coupled to said outlet, for controlling the passage of material therethrough, electromagnetic radiation emitter means located in close proximity to said nozzle, for emitting a controlled radiation beam in the vicinity of said nozzle, electromagnetic radiation detector means located adjacent to said emitter means and responsive to radiation emitted from said emitter means and reflected by a body placed along the emitted radiation path, said emitter and detector means being affixed in a radiation directing and shielding housing, for determining the directivity of the emitted and reflected radiation, and electronic control circuit for controlling said valve means in response to detected radiation reflected by the body placed along the emitted radiation path.

The invention will now be described in connection with certain preferred embodiments with reference to the following illustrative figures so that it may be more fully understood.

With reference now to the figures in detail, it is stressed that the particulars shown are by way of example and for purposes of illustrative discussion of the preferred embodiments of the present invention only and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

For a more complete understanding of the present invention, reference should be made to the following detailed description taken in connection with the accompanying drawings, in which.

Figure 1:
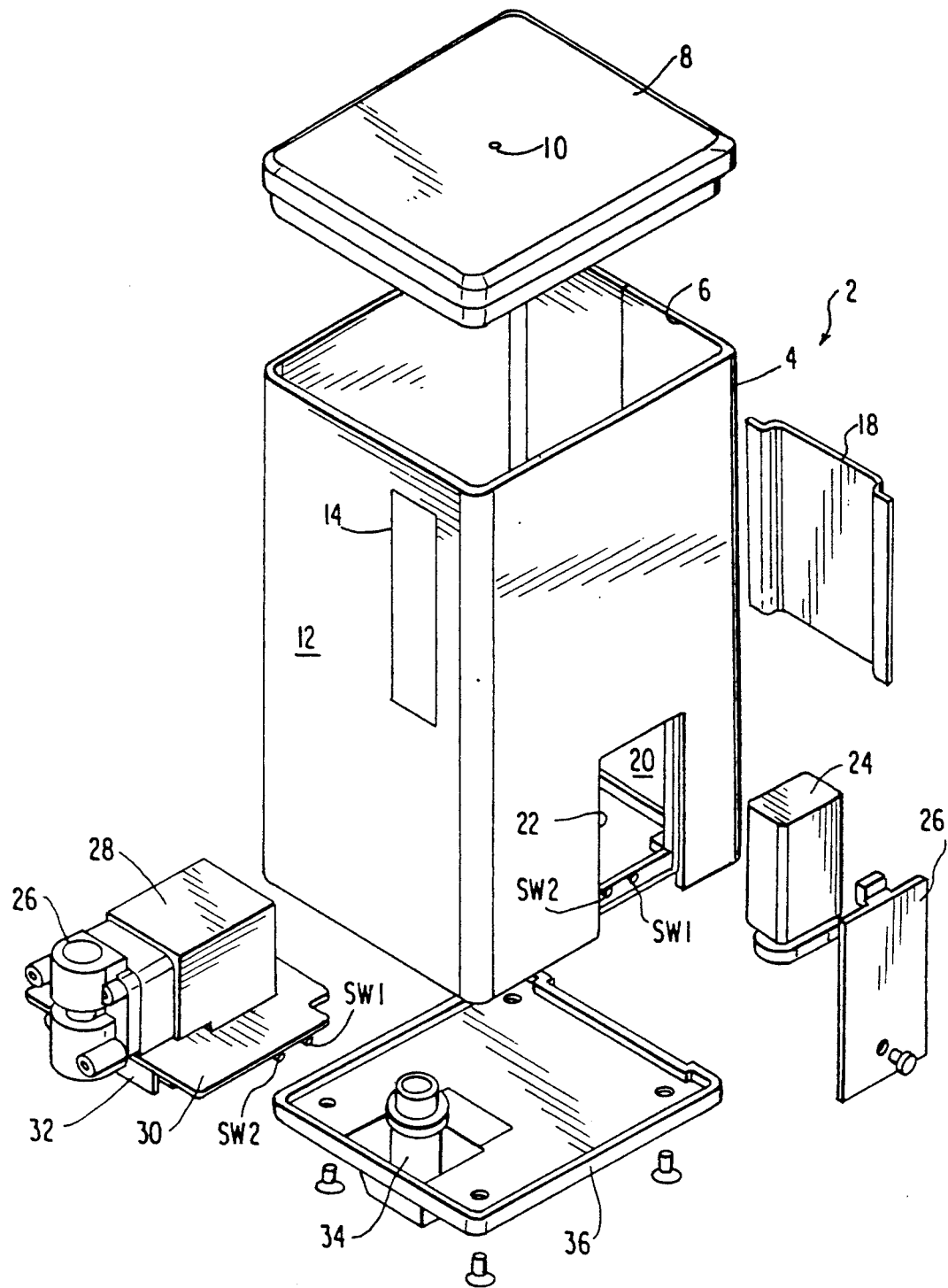
FIG. 1 is an exploded view of the dosing dispenser according to the present invention.
Figure 2:
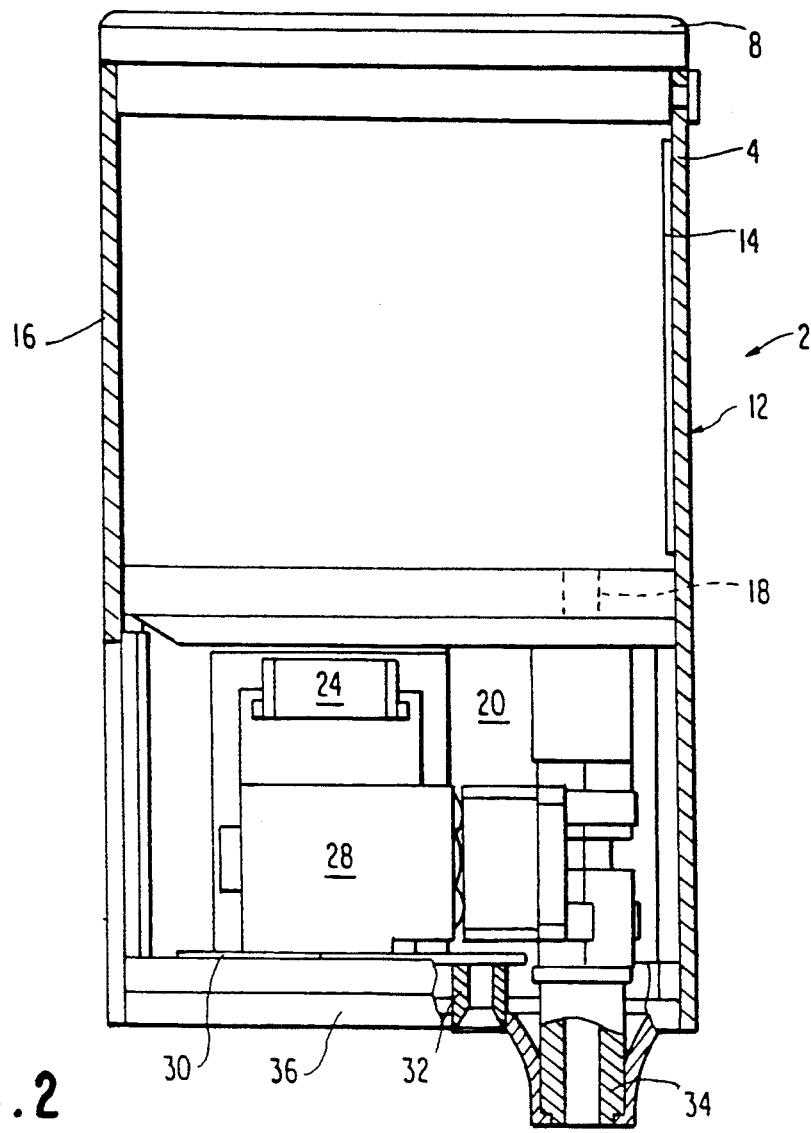
FIG. 2 is a cross-sectional view of the dosing dispenser of FIG. 1 in its assembled state.

In FIGS. 1 and 2 there is illustrated the dosing dispenser 2 according to the present invention, which is composed of a container 4 having an opening 6 for introducing flowable material therein and for the periodic replenishing thereof. The opening 6 is fitted with a cover 8 made with an air intake bore 10. The container has a front face 12, in which advantageously there is formed material level indicator or window 14, and an opposite rear face 16, optionally provided with means cooperating, e.g., with a bracket 18, facilitating affixing the dispenser on a wall. In the bottom wall of the container there is made an outlet 18, through which flowable material stored in the container, can pass. Underneath the container 4 there is formed a compartment 20 accommodating the operating electrical and electronic components and circuits. The D.C. power supply of the dispenser is accessible through an opening 22 made at the side wall of the compartment 20, through which opening a replaceable battery 24 can be installed. The opening 22 is normally closed by the sliding cover plate 26. Further seen is a valve 26 actuatable by a latch solenoid 28. The valve 26, as well as the solenoid 28, are conveniently mounted on a board 30, also serving to support the electronic control circuit of the dispenser. On the same board 30 there is mounted a radiation directing and shielding housing 32 (seen to better advantage in FIG. 3) in which housing there are affixed radiation emitting and detecting means, which will hereinafter be referred to in detail with reference to FIG. 4. A material discharge nozzle 34, coupled through the valve 26 to the outlet 18, protrudes from the bottom cover 36 of the dispenser 2.

Figure 3:
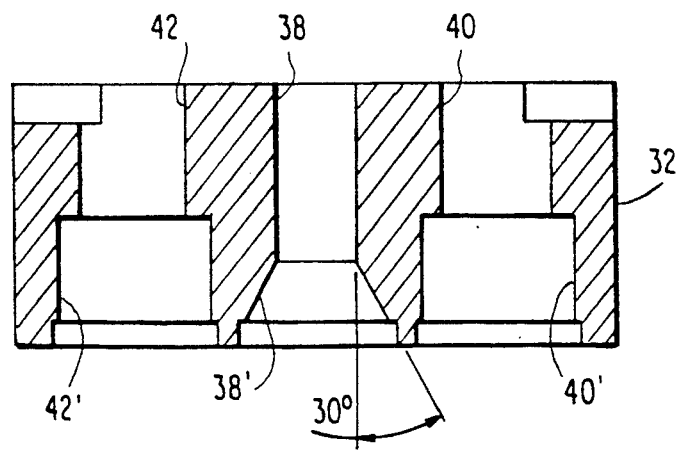
FIG. 3 is a cross-sectional view, drawn to a larger scale, of the radiation directing and shielding housing shown in FIG. 2.

The radiation directing and shielding housing 32, seen in FIG. 3, conveniently formed as a prismatic body, is configured and sized to be affixed in close proximity behind the nozzle 34. The housing 32 includes three bores, a central bore 38 accommodating an emitter (e.g. diode $D_2$, FIG. 4) and two further bores 40 and 42, on opposite sides of the central bore, each accommodating a detector (e.g. diodes $D_3$ and $D_4$, FIG. 4). The wall of the output section 38' of the bore 38 is calculated to be outwardly flaring at an angle of about 30°, so as to direct the emitted radiation onto a limited cross-sectional area just below the nozzle 34, where the user is expected to place his (or her) hand(s). The axes of the bores 40 and 42 are spaced from the axis of the bore 38, at a distance calculated to be capable of receiving radiation reflected from a body placed under the output section 38' from which radiation is emitted at the maximal angle of 30°. Also, the diameters of the output sections 40' and 42' of the bores 40 and 42, respectively, are calculated to receive, i.e., to detect, reflected radiation emanating from a body placed in the illuminated area under the output section 38', and not radiation reflected from other adjacent surfaces, such as the sink.

Figure 4:
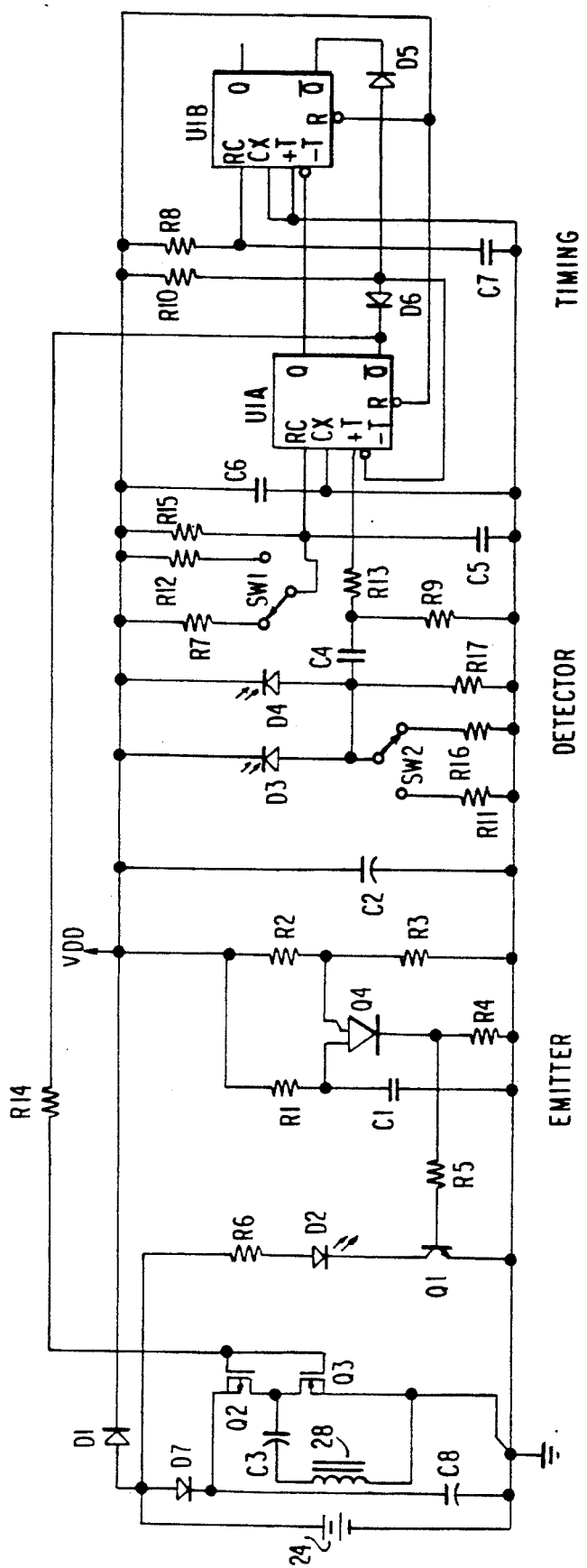
FIG. 4 is a circuit diagram of the electronic control circuit of the dosing dispenser according to the present invention.

Referring to FIG. 4, there is illustrated a preferred embodiment of the electronic control Circuit interconnected with the D.C. power supply, i.e., battery 24, and with the solenoid 28 controlling the open or closed state of the valve 26. In this manner the solenoid controls the passage of material from the container's outlet 18, via the valve 26, to be discharged through the nozzle 34.

The control circuit includes four main circuits: the emitter circuit, the detector circuit, the timing circuit and the solenoid driving circuit.

The emitter circuit is based on a free running oscillator at, e.g., 2.5 Hz, and is embodied by a Programmable Unijunction Transistor Q4 that drives transistor Q1 every 400 msec for a period of 80 microsec. when transistor Q1 conducts, current flows through the emitter diode D2, thereby causing infra-red radiation to be emitted.

The detector circuit is composed of detector diodes D3 and D4. Whenever radiation reflected from a body, such as a user's hand, is detected by at least one of the diodes D3 and D4, current flows therethrough. The current through the diodes D3 and D4 causes a voltage rise on two out of the three resistors R11, or R16, and R17, depending on the setting of the switch SW2. This switch is easily accessible through opening 22 and provides the user with the choice of selecting one out of three different reflected radiation sensitivity grades, most suitable for a particular location where the dispenser is installed. The radiation detection sensitivity adjustment is set in consideration, inter alia, with specific prevailing ambient radiation, e.g., IR radiation emanating from other sources in the vicinity, and reflections of the radiation emitted by the dispenser, caused by surrounding reflecting surfaces. Towards the end of enhancing sensitivity of the system, there is also provided a high-pass filter, composed of the resistor R9 and the capacitor C4, for preventing constant ambient noise and the dependency on variable ambient radiation. This will enable the emittance of narrow band radiation pulses, matching the bandwidth of the detector circuit. The resistor R13, in conjunction with the input capacitance of unit U1A, form a lower-pass filter for preventing unwanted actuation of the dispenser caused by high frenquency noise which may appear across R9. When the voltage on R9 exceeds the supply voltage VDD/2, the timer unit U1A is enabled.

The timing circuit is based on two timing units, U1A and U1B. The setting of the first timer unit U1A determines the period of time that the solenoid 28 is actuated, while the setting of the second timer unit U1B, determines the duration between consecutive operations.

When input +T of timer unit U1A is triggered, the state of the Q output is logic "1" and the state of the $\overline{Q}$ output is switched to logic "0", for a period of time predetermined by the values of capacitor C5, and two out of the three resistors R7, or R12 and R15, which are chosen by the setting of the switch SW1. The switch SW1 is accessible to the user through opening 22 and thus provides the user with means to control the amount of material desired to be discharged. The Q output signal of unit U1A enables the solenoid's driver, consisting of MOSFET transistors Q2, Q3, capacitor C3 and resistor R14. As seen, the gates of the transistors Q2 and Q3 are commonly connected and lead through resistor R14 to the $\overline{Q}$ output terminal of unit U1A.

When the Q output of unit U1A turns to logic "0" the second timing unit U1B is enabled by the falling edge trigger signal at the −T input terminal of unit U1B. The $\overline{Q}$ output terminal of unit U1B assumes a logic "0" state for a period of time predetermined by the combination of capacitor C7 and resistor R8. It is possible to adjust this time period by proper selection or adjustment of resistor R8. The $\overline{Q}$ ouput signals from units U1A and U1B are connected through diodes D5 and D6 to the −T input terminal of unit U1A. These two diodes form an AND gate which inhibits reoperation of the first timer unit U1A before a full cycle of the second timing unit U1B, is completed.

The operation of the control circuit is as follows: in the normal setting, $\overline{Q}$ terminal of unit U1A is in the logic "1" state, transistor Q3 conducts, transistor Q2 is OFF and citor C3 is discharged. When terminal $\overline{Q}$ of unit U1A switches to logic "0" transitor Q3 switches OFF transistor Q2 turns ON. Capacitor C3 is thus charged through the latch solenoid 28 via transistor Q2, and affects the opening of the valve 26, thereby allowing material to flow therethrough. When terminal $\overline{Q}$ of unit U1A returns to logic "0", the capacitor C3 is discharged through the latch solenoid 28 via transistor Q3. This reverses the operation of the latch solenoid, closes the valve and stops the flow of material.

It is important to note that the time period which the valve is ON, does not affect the energy consumption of the system, since the energy consumption is determined only by the size of the capacitor C3.

It will be evident to those skilled in the art that the invention is not limited to the details of the foregoing illustrative embodiments, and that the present invention may be embodied in other specific forms without departing from the essential attributes thereof, and it is therefore desired that the present embodiments be considered in all respects as illustrative and not restrictive, reference being made to the appended claims, rather than to the foregoing description, and all changes which come within the meaning and range of equivalency of the claims are therefore intended to be embraced therein.

What is claimed is:

1. A dosing dispenser for flowable material, comprising:
   a container having a material introducing aperture and an outlet, through which material freely discharges by gravity only;
   electrically operated valve means having an open state and a closed state and including a nozzle coupled to said outlet, for controlling the passage of material therethrough;

electromagnetic radiation emitter means located in close proximity to said nozzle, for emitting a controlled radiation beam in the vicinity of said nozzle;

electromagnetic radiation detector means located adjacent to said emitter means and responsive to radiation emitted from said emitter means and reflected by a body placed along the emitted radiation path;

said emitter and detector means being affixed in a radiation directing and shielding housing, for determining the directivity of the emitted and reflected radiation;

said electronic control circuit for controlling said valve means in response to detected radiation reflected by the body placed along the emitted radiation path;

said control circuit includes means for adjusting the period of time which said valve means is kept in its open state for allowing free passage of material through said nozzle, thereby controlling the amount of material to be discharged, and further includes switch means associated with said detector means for adjusting the detection sensitivity of reflected radiation.

2. The dispenser as claimed in claim 1, wherein said container has a front face and a rear face and said nozzle protrudes from underneath the dispenser adjacent to said front face.

3. The dispenser as claimed in claim 2, wherein said radiation directing and shielding housing, accommodating said emitter and detector means is disposed between said nozzle and said rear face.

4. The dispenser as claimed in claim 1, wherein there is provided a single emitter means and at least two detector means disposed on opposite sides of said emitter means.

5. The dispenser as claimed in claim 1, wherein said electrically operated valve means includes a latch solenoid valve.

* * * * *